(12) United States Patent
Gardner

(10) Patent No.: US 12,394,878 B2
(45) Date of Patent: Aug. 19, 2025

(54) SOLAR-POWERED ELECTRONIC SYSTEM

(71) Applicant: MeshPlusPlus, Inc., Chicago, IL (US)

(72) Inventor: Daniel Gardner, Glenview, IL (US)

(73) Assignee: MeshPlusPlus, Inc., Chicago, IL (US)

( * ) Notice: Subject to any disclaimer, the term of this patent is extended or adjusted under 35 U.S.C. 154(b) by 584 days.

(21) Appl. No.: 17/670,210

(22) Filed: Feb. 11, 2022

(65) Prior Publication Data

US 2022/0263216 A1    Aug. 18, 2022

Related U.S. Application Data

(60) Provisional application No. 63/200,095, filed on Feb. 12, 2021.

(51) Int. Cl.

| | |
|---|---|
| *F16C 11/04* | (2006.01) |
| *H01Q 1/12* | (2006.01) |
| *H02S 20/20* | (2014.01) |
| *H02S 20/30* | (2014.01) |
| *H05K 7/20* | (2006.01) |
| *H01Q 1/22* | (2006.01) |

(52) U.S. Cl.
CPC .............. *H01Q 1/125* (2013.01); *F16C 11/04* (2013.01); *H02S 20/20* (2014.12); *H02S 20/30* (2014.12); *H05K 7/2039* (2013.01); *H01Q 1/2291* (2013.01)

(58) Field of Classification Search
CPC ...... H01Q 1/125; H01Q 1/2291; H02S 20/20; H02S 20/30; F16C 11/04; H05K 7/2039
See application file for complete search history.

(56) References Cited

U.S. PATENT DOCUMENTS

| | | | | |
|---|---|---|---|---|
| 11,539,111 | B1* | 12/2022 | Raybern | H01Q 1/1228 |
| 2011/0283755 | A1* | 11/2011 | Chen | G09F 3/0376 |
| | | | | 70/158 |
| 2020/0292919 | A1* | 9/2020 | Goodman | H04N 23/54 |
| 2022/0263456 | A1 | 8/2022 | Gardner | |

FOREIGN PATENT DOCUMENTS

CN            111835274 A    10/2020

* cited by examiner

*Primary Examiner* — Mayla Gonzalez Ramos
(74) *Attorney, Agent, or Firm* — MARSHALL, GERSTEIN & BORUN LLP

(57) ABSTRACT

Disclosed herein includes a quick-release tubular seal including a tube having a first end and a second end. The quick-release tubular seal also includes first seal assembly configured to selectively seal against the first end of the tube and a second seal assembly configured to selectively seal against the second end of the tube. Additionally, the quick-release tubular seal includes a cam disposed on the first seal assembly, the cam being operable between a first position and a second position. The quick-release tubular seal includes a shaft mechanically coupled to the cam, the first seal assembly, and the second seal assembly, the shaft configured to actuate both the first seal assembly to seal against the first end of the tube and actuate the second seal assembly to seal against the second end of the tube when the cam is actuated from the first position to the second position.

8 Claims, 18 Drawing Sheets

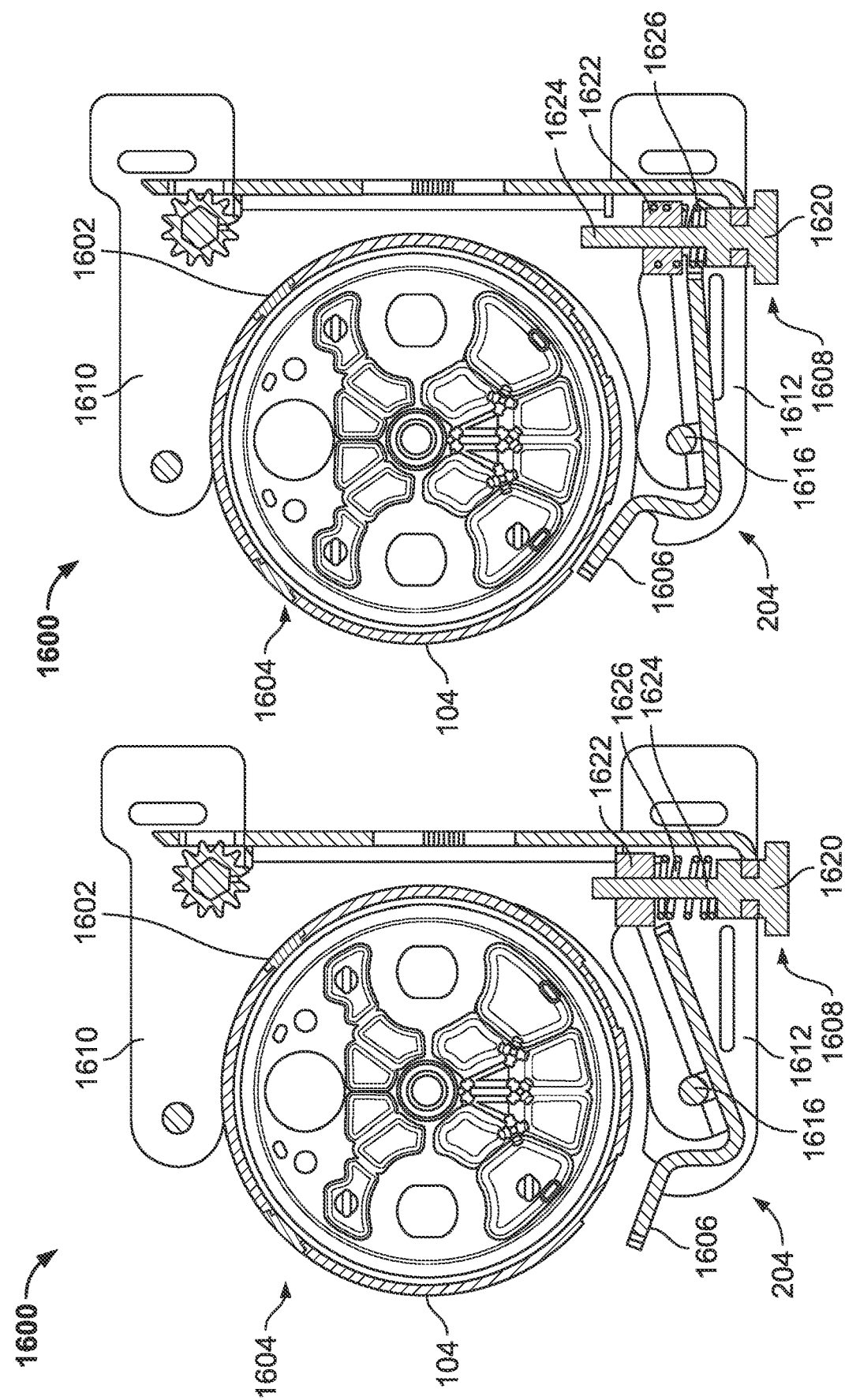

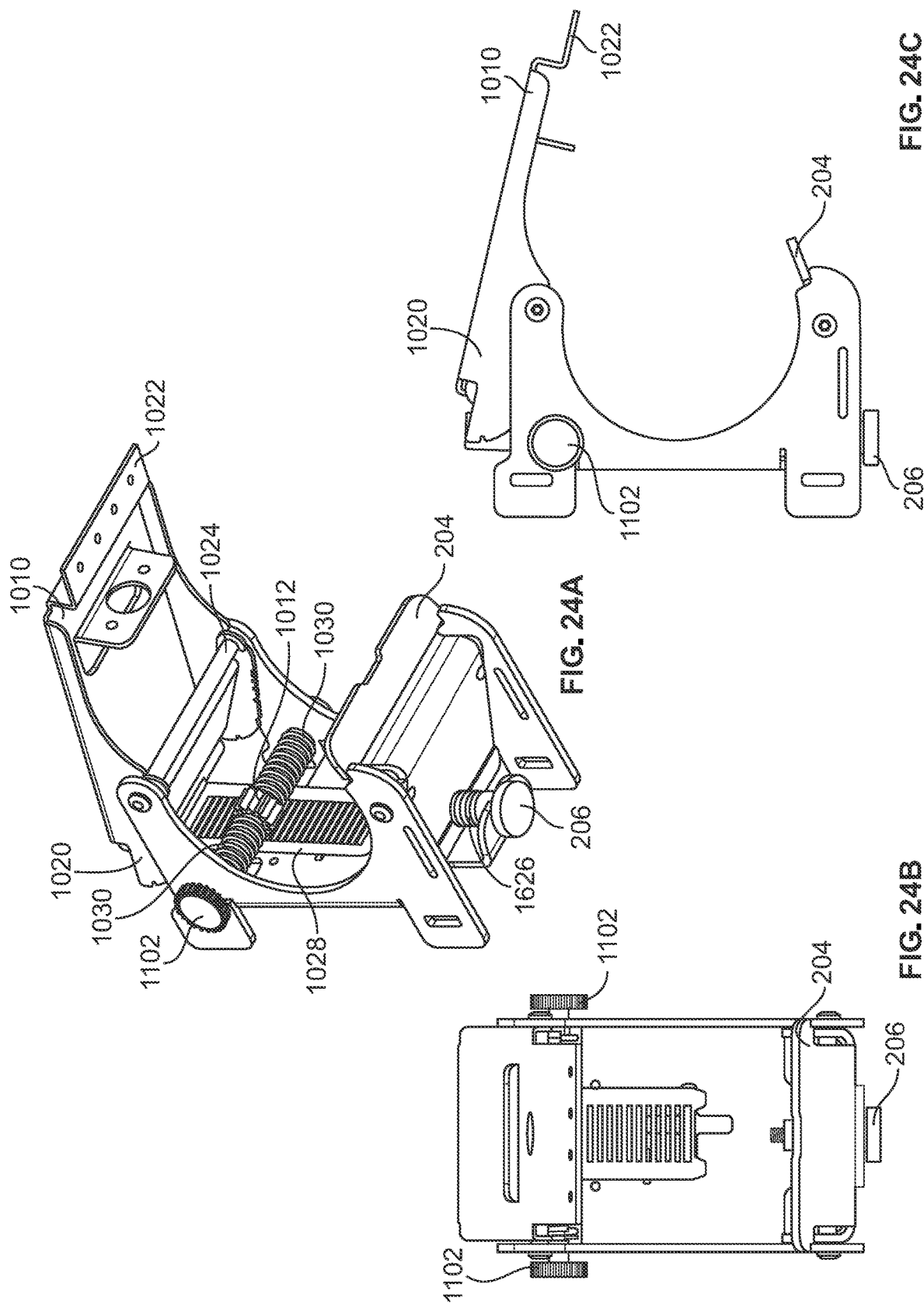

SOLAR-POWERED ELECTRONIC SYSTEM

CROSS-REFERENCE TO RELATED APPLICATION

This application claims the benefit of the filing date of U.S. Provisional Patent Application No. 63/200,095, filed Feb. 12, 2021. The contents of U.S. Provisional Patent Application No. 63/200,095 is hereby incorporated by reference in its entirety.

FIELD OF THE DISCLOSURE

The present disclosure relates to outdoor electronic devices and, more particularly, to mechanisms for mounting solar-powered devices in outdoor environments.

BACKGROUND

Certain electronic devices, such as wireless routers, sensors, power controllers, etc. can be installed outdoors in difficult-to-reach places such as utility poles or rooftops. For example, solar-powered devices such as wireless routers that operate according to IEEE 802.11 standards (generally known as WiFi® routers) can be disposed on utility poles. To protect the electronics from water or dust, mounted electronic devices can include various levels of environmental protection. For example, electronic devices can be sealed inside a protective housing.

However, as technology improves, electronic devices disposed in the field may require upgrades or replacement of certain components, and sealing makes access to these devices more difficult. On the other hand, lack of sealing generally provides lower levels of protection.

Further, electronic devices equipped with antennas (such as wireless routers mentioned above) require additional cabling between antennas and processing circuitry. Mounting mechanisms that require long cables interconnecting such components present additional difficulties because long cables are generally lossy.

Still further, some installations may include power sources such as solar panels along with electronic components. For example, it may be desirable to place a solar power in close proximity to a wireless router to eliminate wired connections to the wireless router. The solar power in such a system may require re-orientation to optimize power output.

SUMMARY

In one example implementation, a mechanism of this disclosure includes a quick-release tubular seal including a tube having a first end and a second end. The quick-release tubular seal also includes a first seal assembly configured to selectively seal against the first end of the tube and a second seal assembly configured to selectively seal against the second end of the tube. Additionally, the quick-release tubular seal includes a cam disposed on the first seal assembly, the cam being operable between a first position and a second position. The quick-release tubular seal includes a shaft mechanically coupled to the cam, the first seal assembly, and the second seal assembly, the shaft configured to actuate both the first seal assembly to seal against the first end of the tube and actuate the second seal assembly to seal against the second end of the tube when the cam is actuated from the first position to the second position.

Also disclosed herein is a sealed tubular antenna alignment system including a tube having a window disposed approximate a first end and a cap disposed on the first end, the cap including a key to orient the cap with the tube. The sealed tubular antenna alignment system also includes an antenna coupled to the cap, wherein the key configured to orient the cap aligns the antenna with the window.

Also disclosed herein is a sealed tubular antenna alignment system including a tube having a window disposed approximate a first end and an electronics module pivotably and axially movable relative to the tube. The sealed tubular antenna alignment system also includes an antenna coupled to the electronics module, wherein the electronics module is configured to position the antenna adjacent to the window.

Additionally disclosed herein is a solar panel angle adjustment system for actuation with a single hand, comprising of a mounting panel rotationally coupled to an axle and a positioning member configured to control the angular position of the mounting panel. The solar panel angle adjustment system also includes an adjustment mechanism adapted to lock the positioning member in a first position and adapted to adjust the positioning member in the second position and a biasing member adapted to bias the adjustment mechanism to the first position. Further including when the positioning member adjusts the angle of the mounting panel in response to the control member actuating the adjustment mechanism in the second position.

Also disclosed herein is a solar panel angle adjustment system for actuation with a single hand, comprising a mounting panel rotationally coupled to an axle, the mounting panel configured to couple with a solar panel. The solar panel adjustment system also includes a tensioned variable ribbon configured to adjust the angular position of the mounting panel and a gear adapted to adjust the tensioned variable ribbon and configured to translate between a first position and a second position. Further, disclosed is a gear shaft mechanically coupled with the gear and configured to translate from the first position to the second position and actuate the gear and a spring adapted to bias the gear from the second position to the first position. Wherein the tensioned variable ribbon adjusts the angle of the mounting panel in response to the gear shaft actuating the gear in the second position, and wherein the gear shaft is locked when disposed in the first position.

Also disclosed herein is a rotational panel quick lock, comprising of a first panel including a first slot configured to receive a first axle and a first aperture disposed adjacent the slot and a second panel, pivotable relative to the first panel, including a second slot configured to receive the axle and a second aperture disposed adjacent to the slot. The second panel of the rotational panel quick lock is pivotable between a first position and a second position and a pivoting axle passes through the first aperture and the second aperture. The second slot of the rotational panel quick lock in the second position is both aligned with the first slot and disposed at an angle relative to the first slot, thereby closing the first slot.

Additionally disclosed herein is a tubular clamping mechanism, comprising of a static cradle defining a tubular slot having an upper portion and a lower portion. The tubular clamping mechanism also includes a pivotable clamp disposed in the lower portion of the static cradle and pivotable about an axle between a first position and a second position. The tubular clamping mechanism also includes an adjustment mechanism to pivot the clamp from the first position to the second position, wherein the clamp in the second position encloses a portion of the tubular slot.

Further disclosed herein is a sealed-tube heat exchanger, comprising a tube, a heat sink axially movable relative to the enclosed tube, and a biasing member configured to bias the heat sink against an inner surface of the enclosed tube.

BRIEF DESCRIPTION OF THE DRAWINGS

FIG. 16 is a side view of the mount clamp, in accordance with the present disclosure, in an open configuration.

FIG. 17 is a side view of the mount clamp, in accordance with the present disclosure, in a closed configuration.

FIGS. 24A, 24B, and 24C are alternative views of the mount and mounting panel.

DETAILED DESCRIPTION

Generally speaking, the mechanisms of this disclosure improve accessibility to, and simplify maintenance of, electronic devices installed outdoors. The techniques of this disclosure are particularly useful in application to wireless routers installed on exterior structures (especially utility poles) and powered by solar panels. As discussed below, an example solar-powered electronic system of the present disclosure include several mechanisms that allow for one person to set up and replace electronic modules. Additionally, the solar-powered electronic system is designed to withstand rain, dust, sand, and (in some cases) submersion.

Figure 1:
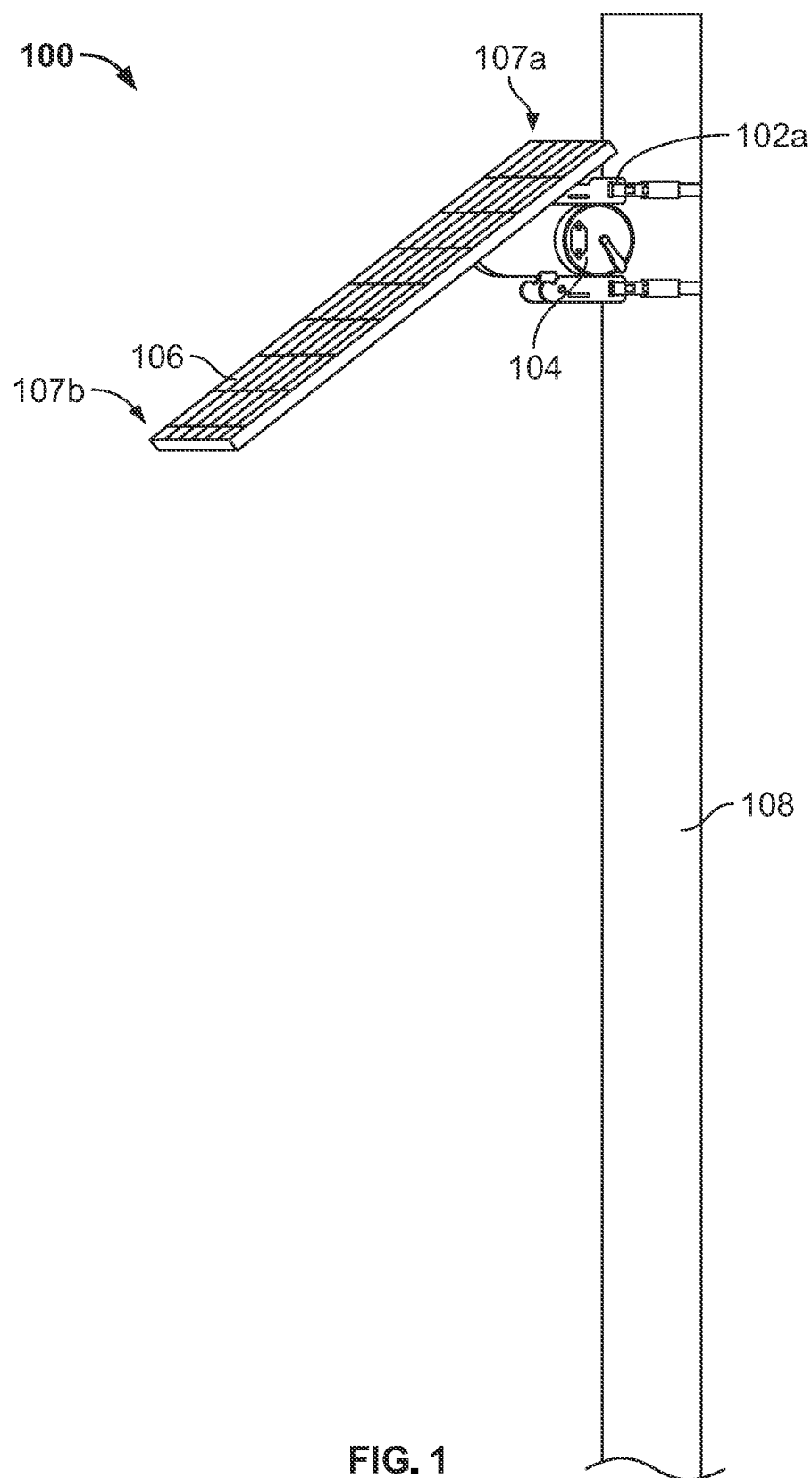
FIG. 1 is a perspective view of the solar-powered electronic system in accordance with the present disclosure.

FIG. 1 is a perspective view of a solar-powered electronic system 100 in accordance with the present disclosure. The solar-powered electronic system 100 includes a mount 102, a tube 104, and a solar panel 106 having a proximal end 107a and a distal end 107b. As shown, the solar-powered electronic system 100 is mounted to a utility pole 108; however, the solar-powered electronic system 100 in other situations can be mounted on lamp posts, trees, etc. The mount 102 includes a pair of hose clamps or steel banding to secure the mount 102 to the utility pole 108. Additionally, in other examples, the solar-powered electronic system 100 is mounted onto other surfaces such as buildings and other infrastructure, or even vehicles. In such examples, bolts can pass through mount 102 into a flat surface to secure the mount 102 to the building or other infrastructure. Additionally, both the tube 104 and the solar panel 106 are both disposed on the mount 102.

Figure 2:
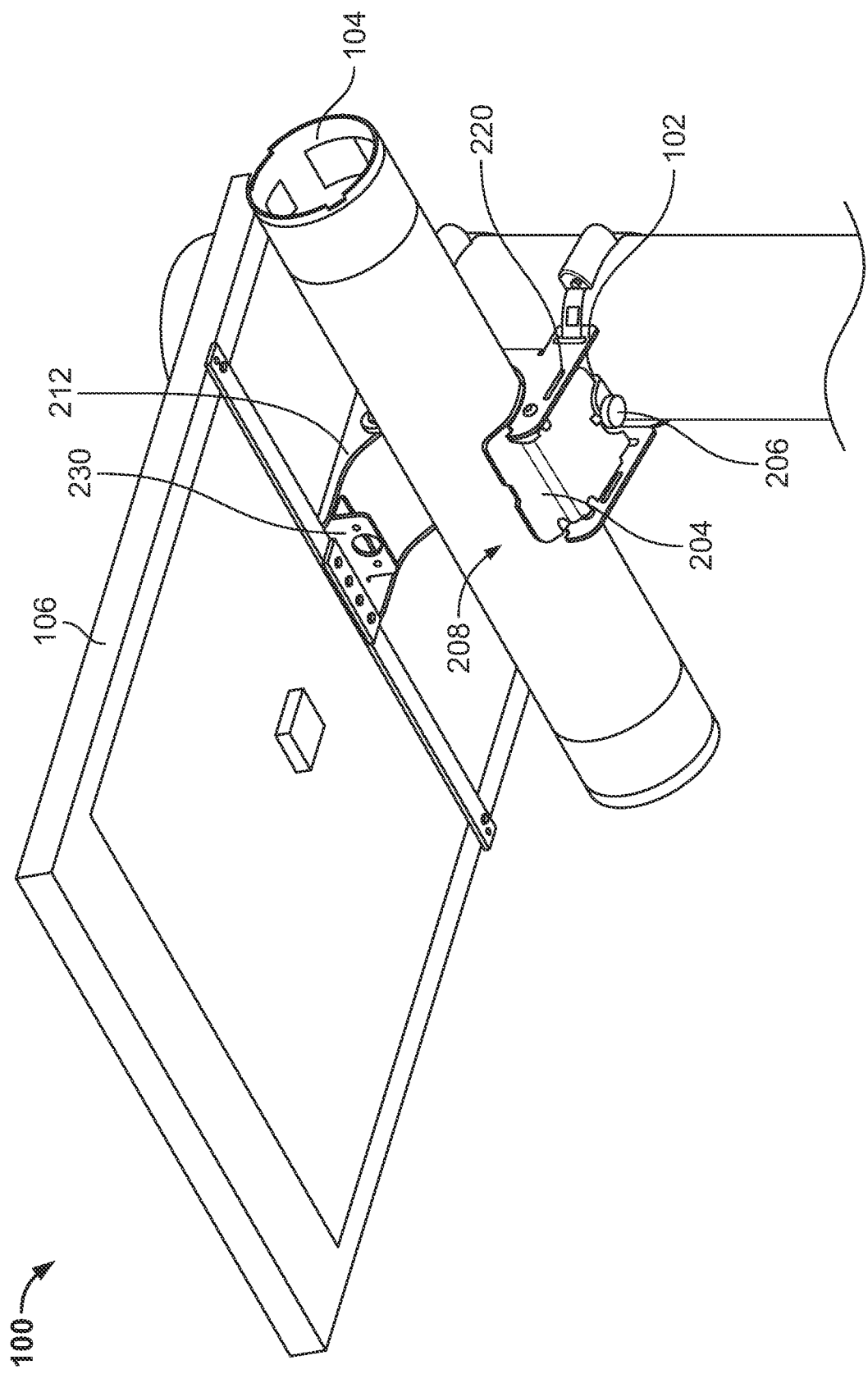
FIG. 2 is another view of the solar-powered electronic system of FIG. 1 in accordance with the present disclosure.
Figure 3:
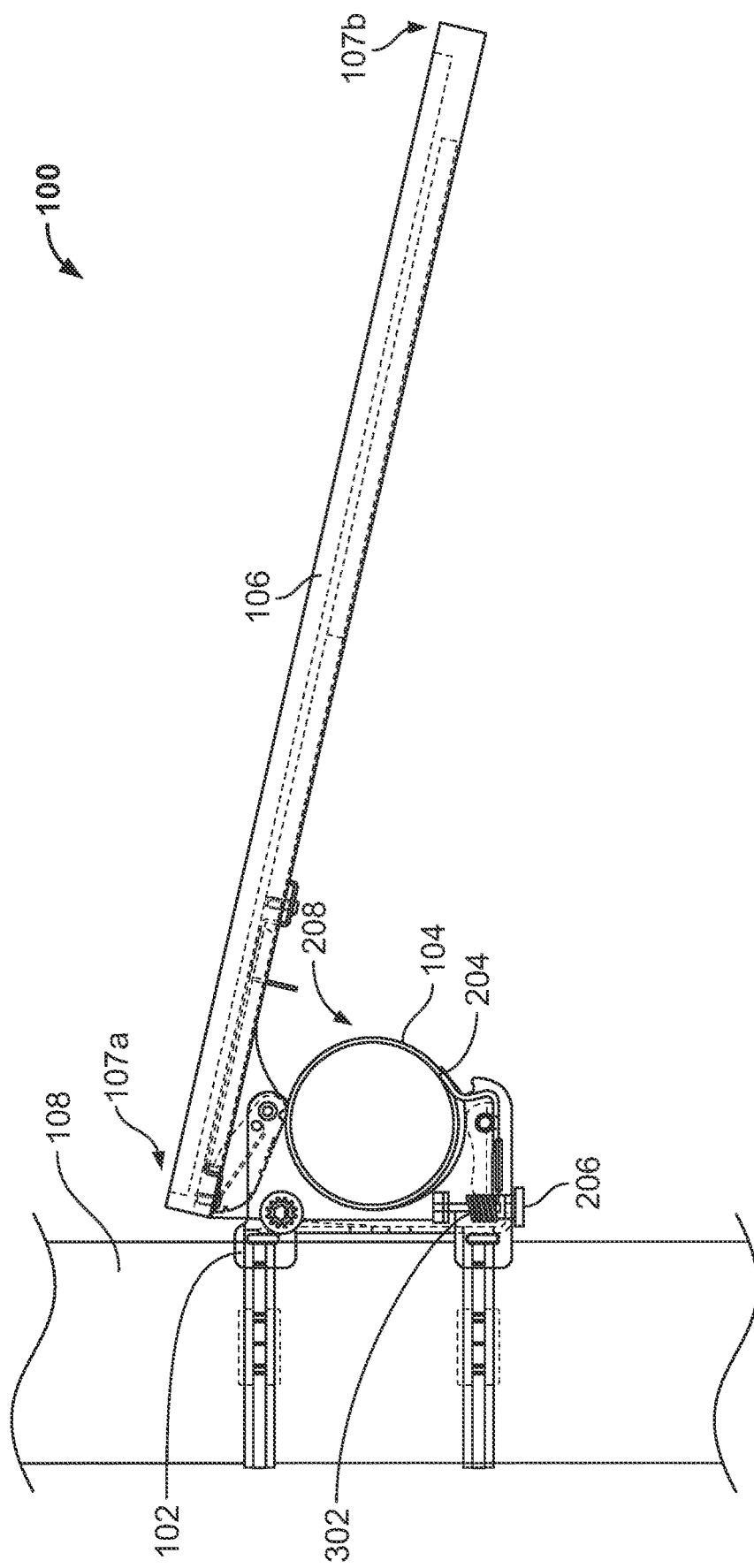
FIG. 3 is an alternative view of the solar-powered electronic system of FIG. 1 in accordance with the present disclosure.

FIGS. 2 and 3 are alternative views of the solar-powered electronic system 100 of FIG. 1 in accordance with the present disclosure. The mount 102 of FIGS. 1 and 2 includes a mounting clamp 204 controlled by a clamping knob 206. The mounting clamp 204 and clamping knob 206 (discussed in greater detail below) secure the tube 104 in the mount 102. The mount 102 includes an opening 208 that is generally semi-circular. As a result, in operation, the mounting clamp 204 closes off the opening 208 and also secures the tube 104 to an upper end of the mount 102.

In some examples, the mount 102 includes an additional mounting feature 220. The mounting feature 220 can include various slots and connections to attach modules to the mount 102. These modules can further increase the modularity of the solar-powered electronic system 100. Additionally, the solar-powered electronic system 100 includes a power connection 230 disposed on mounting bracket 1010 (discussed in greater detail in connection with FIG. 10). The power connection 230 can facilitate power connections between the solar panel 106 and the mount 102 and/or modules disposed on the mounting feature 220.

Figure 4:
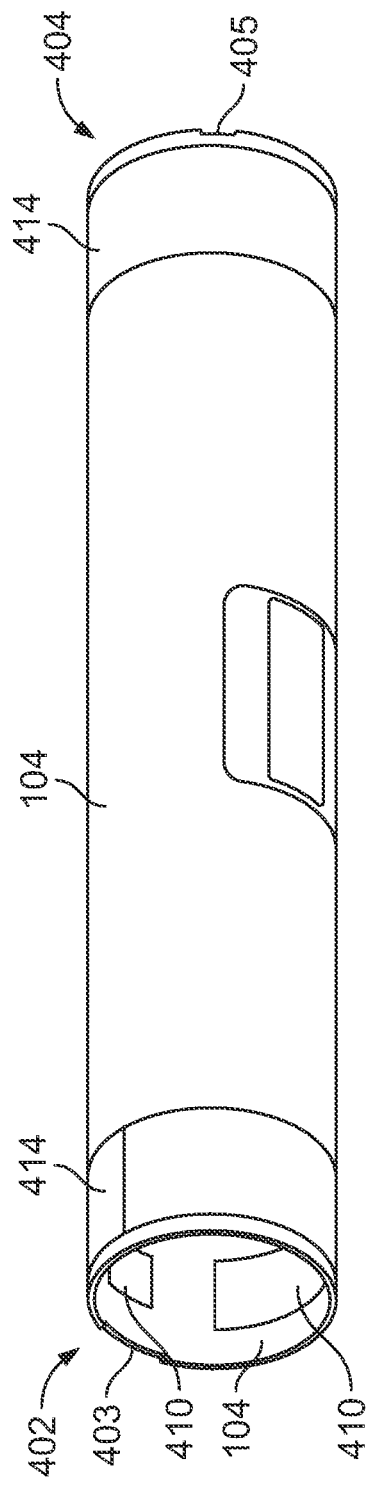
FIG. 4 is a view of the tube of FIG. 1 in accordance with the present disclosure.

FIG. 4 is a perspective view of the tube 104 of FIG. 1. In some examples, the tube 104 is an aluminum tube, but generally the tube 104 can be manufactured using various materials. In preferential alternatives, the tube 104 is made of material with a high thermal conductivity. The tube 104 includes a first end 402 having a first key 403 and a second end 404 having a second key 405. As shown in FIG. 4, the tube 104 includes windows 410 disposed proximate the first end 402. In some examples, the tube 104 further includes windows 412 disposed on the second end 404. The tube 104 also includes a non-metallic cover 414 disposed over the windows 410. The non-metallic cover 414 seals the window from exterior environment. In some examples, the non-metallic cover 414 is transparent such that numerous electromagnetic waves can pass through the non-metallic cover 414 (e.g., optical electromagnetic waves, radio waves, etc.). For example, the non-metallic could be a transparent polycarbonate. In other examples, the non-metallic cover 414 is not transparent to some electromagnetic waves (e.g., optical electromagnetic waves) but still transparent to other electromagnetic waves (e.g., radio waves).

Figure 5:
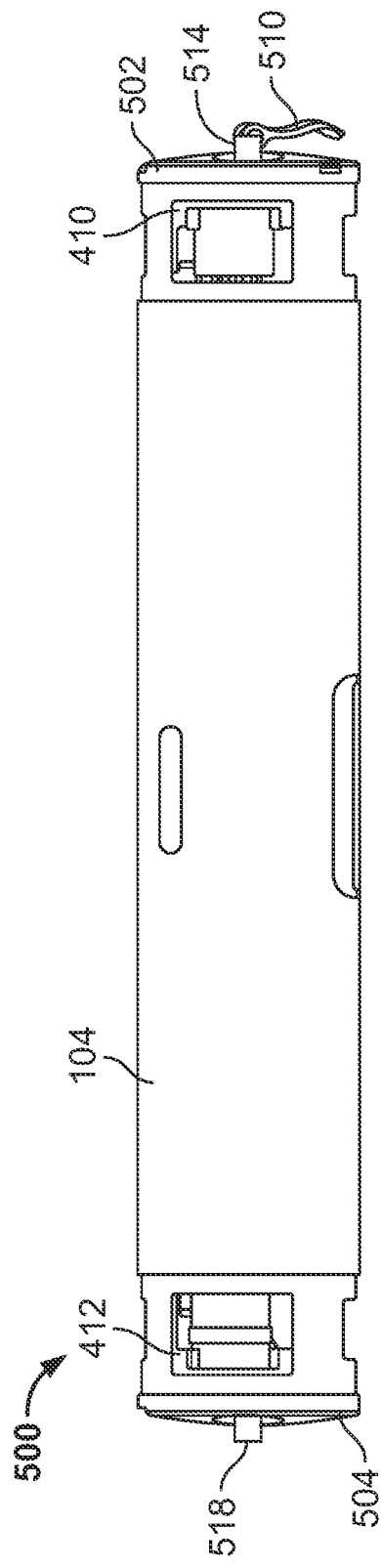
FIG. 5 is a side view of an enclosed wireless router configured for use with the solar-powered electronic system of FIG. 1.

FIG. 5 is a side view of an enclosed wireless router 500 or electronic module configured for use with the solar-powered electronic system of FIG. 1. The enclosed wireless router 500 includes the tube 104 of FIG. 4, a first cap 502 disposed adjacent the first end 402 of the tube 104, and a second cap 504 disposed adjacent the second end 404. The first cap 502 includes a cam 510 connected to a shaft 514. The cam 510 can be actuated between a first position and a second position to actuate the shaft 514. The shaft 514 passes through the tube 104 along the longitudinal axis of the tube 104, and terminates at the second cap 504. For example, the shaft 514 terminates at a nut 518 disposed on the second cap 504. The shaft 514 is discussed in greater detail in connection with FIGS. 6 and 7.

Figure 6:
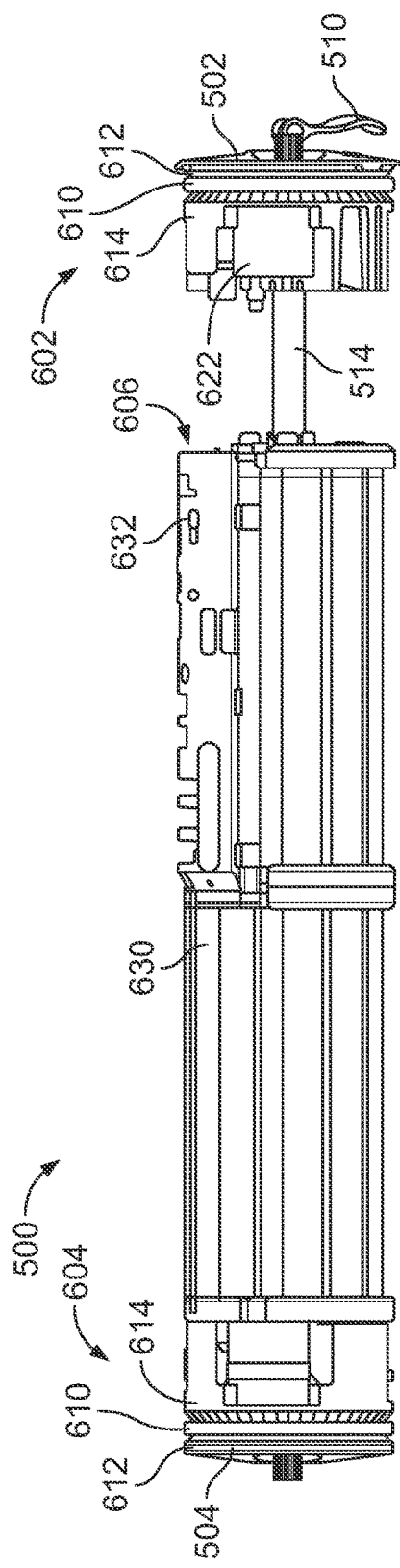
FIG. 6 is a side view of the internally mounted wireless router electronics configured for use with the solar-powered electronic system of FIG. 1 and FIG. 2.

FIG. 6 is a side view of the enclosed wireless router 500 configured for use with the solar-powered electronic system of FIG. 1 and FIG. 2. The enclosed wireless router 500 includes a first seal assembly 602, a second seal assembly 604, and an electronics module 606. As shown, the first seal assembly 602 is disposed adjacent to the first cap 502 and the second seal assembly 604 is disposed adjacent to the second cap 504. In some examples, the seal assembly is integral with the corresponding cap or disposed within the corresponding cap.

As shown, the first seal assembly 602 and the second seal assembly 604 define radial seals including a sealing ring 610 disposed between and a first beveled plate 612 and a second beveled plate 614. In some examples, the sealing ring 610 is a silicone ring. In other examples, the sealing ring 610 is made of another gasket material. Additionally, the sealing ring 610 includes a triangular cross-sectional shape. In some examples, the sealing ring 610 has different cross sectional shapes such as circular, quadrilateral, pentagonal, etc. As a result, movement of the second beveled plate 614 towards the first beveled plate 612 displaces the sealing ring 610 radially outward. The shape of the sealing ring 610 cooperates with the first beveled plate 612 and the second beveled plate 614 to displace the sealing ring 610 radially outward. The first beveled plate 612 is movable relative to the second beveled plate 614. When disposed within the tube 104, the first seal assembly 602 and the second seal assembly 604 seals the tube 104 from the external environment. In some examples, the first seal assembly 602 and the second seal assembly 604 cause the tube 104 to be airtight (i.e., inhibit the movement of gas into or out of the tube 104).

The first cap 502 includes the cam 510. As shown in FIG. 6, the cam 510 is in a first position. In the first position, the first beveled plate 612 and the second beveled plate 614 are pressed together to displace the sealing ring 610 outward in a sealing position. In a second position, the cam 510 causes the first beveled plate 612 and the second beveled plate 614 to separate and no longer displace the sealing ring 610 outward. In some examples, the cam 510 is perpendicular with the longitudinal axis in the first position and parallel with the longitudinal axis in the second position.

Figure 7:
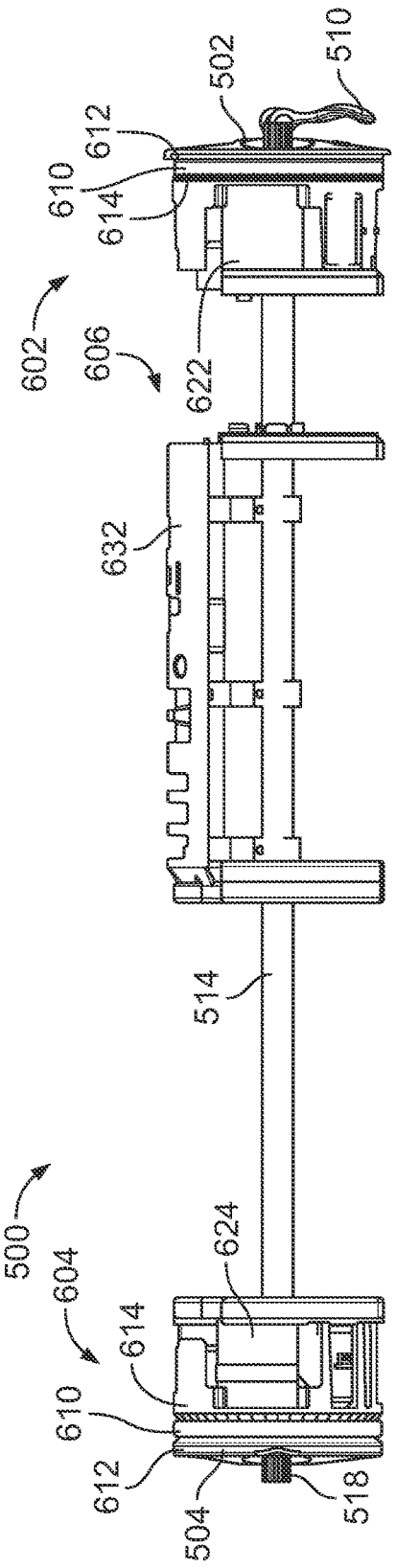
FIG. 7 is a side view of the internally mounted wireless router electronics of the present disclosure.

As shown in FIGS. 6 and 7, the first cap 502 includes first antennas 622 and the second cap 504 includes second antennas 624. Additionally, the first cap 502 and the second cap 504 are connected by the shaft 626. The first cap 502, the first antennas 622, the second cap 504, the second antennas 624, and the shaft 626 comprise the electronics module 606. The electronics module 606 is pivotably and axially movable relative to the tube 104, but in some examples, the electronics module is only axially movable relative to the tube 104. Additionally, in accordance with the present disclosure, the electronics module 606 is configured to position at least one of the antennas adjacent to one of the windows (e.g., windows 410 or windows 412). Permanently-placed antennas would require long, flexible cables when attached to a moving electronics module. This window and alignment system keeps the antennas mounted to the same structure as the electronics for short, potentially rigid low-loss antenna cables.

Figure 19:
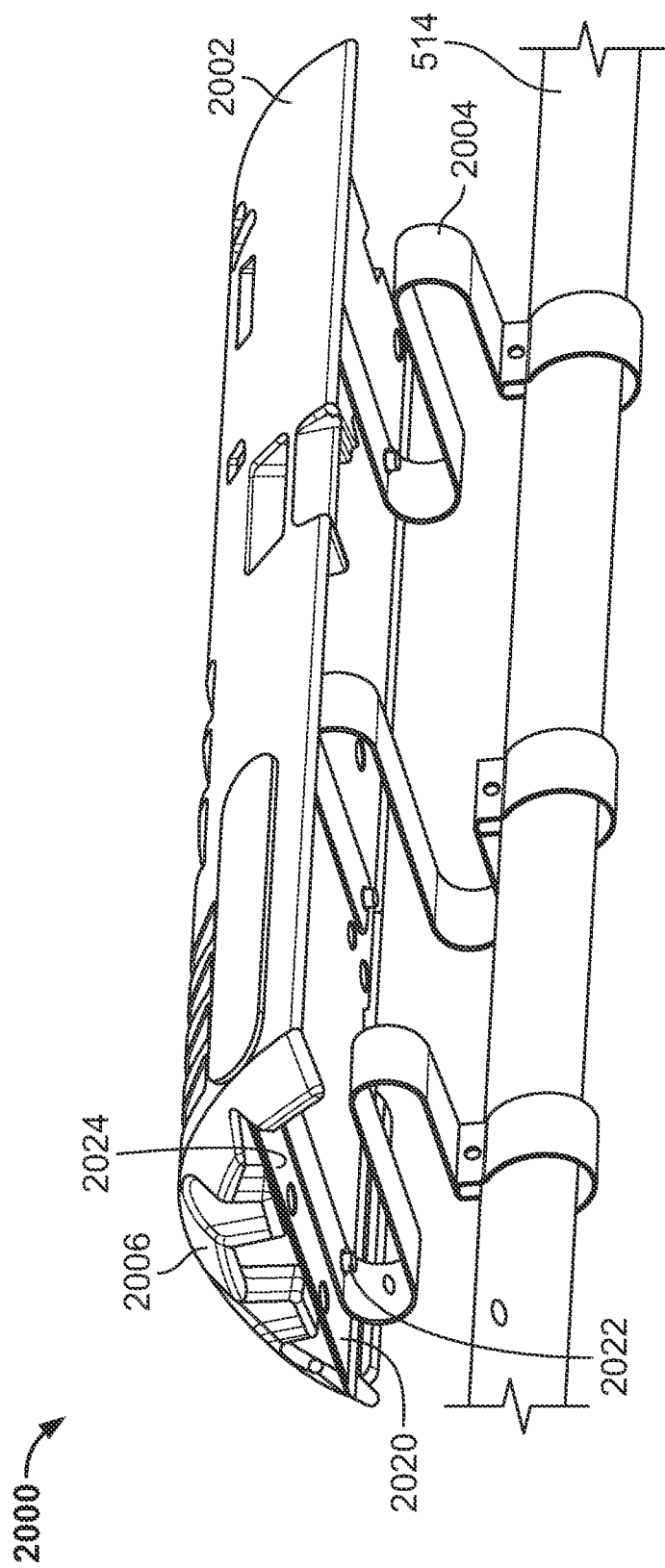
FIG. 19 is a perspective view of a sliding heat spreader in accordance with the present disclosure.
Figure 20:
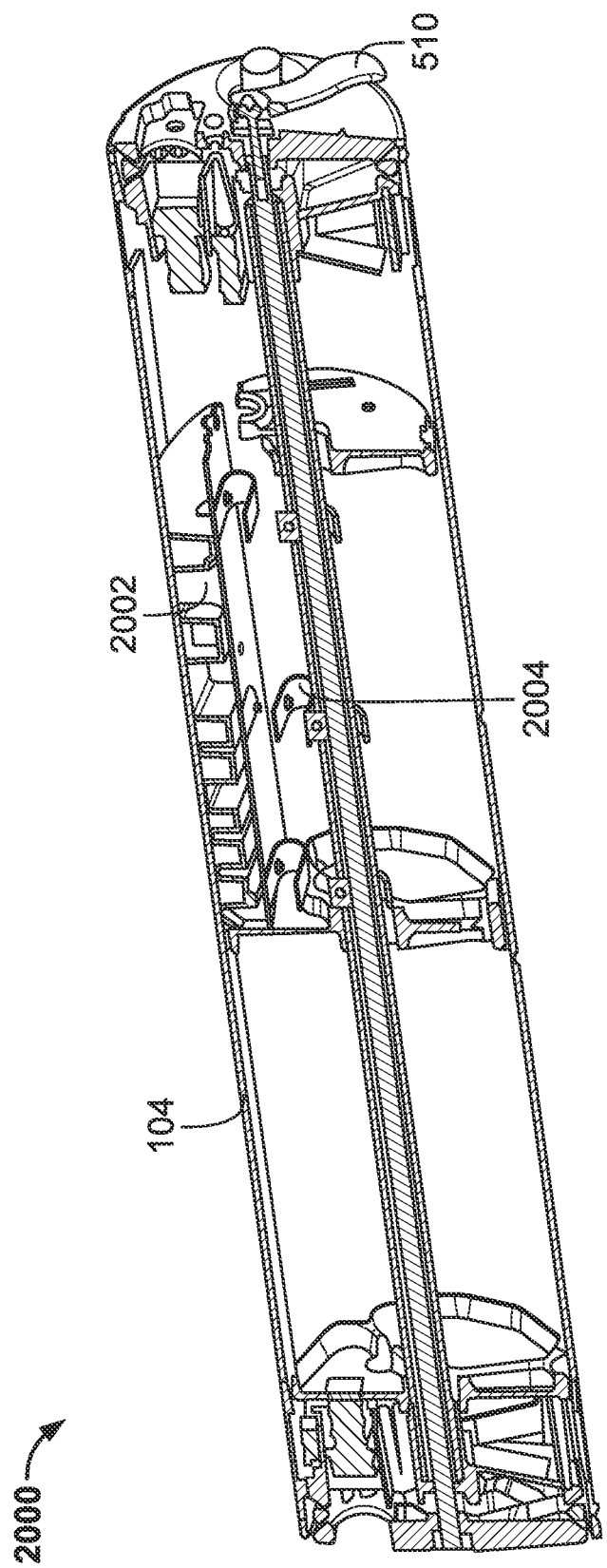
FIG. 20 is a perspective cross-section view of the enclosed wireless router including the sliding heat spreader of FIG. 19.
Figure 21:
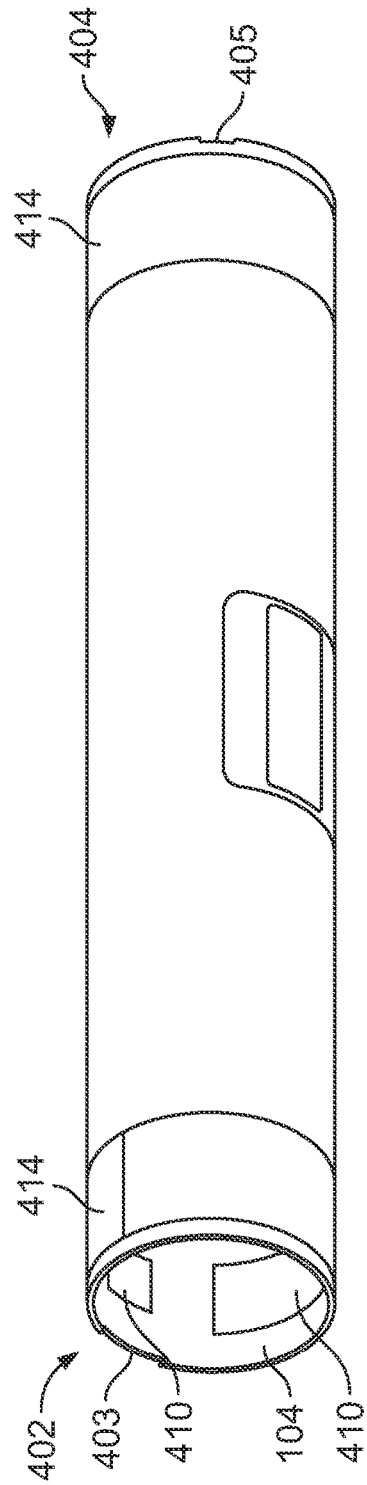
FIG. 21 is an additional view of the tube in accordance with the present disclosure.
Figure 22:
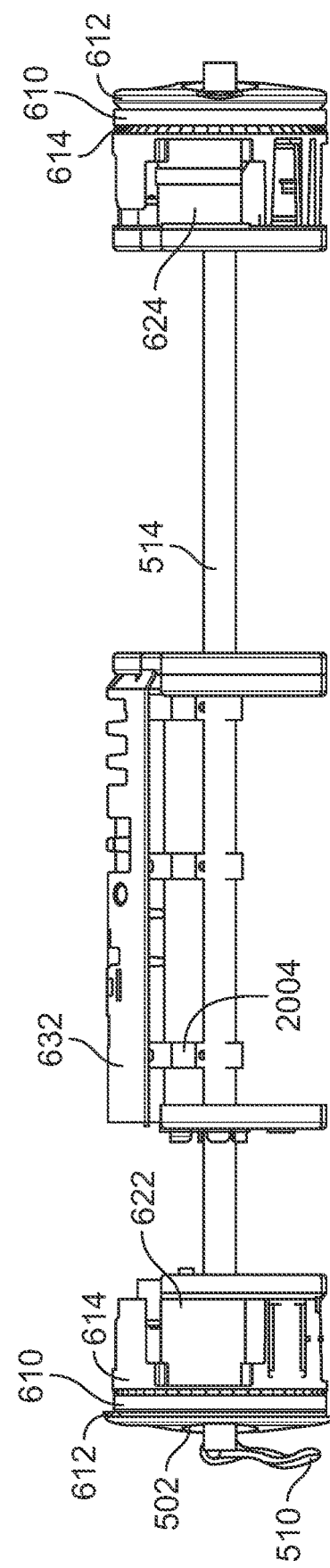
FIG. 22 is an additional side view of the electronic mount in accordance with the present disclosure.
Figure 23B:
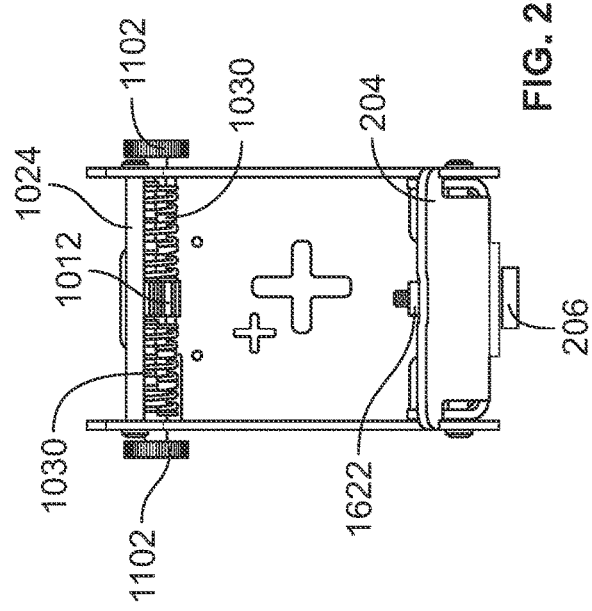
FIGS. 23A, 23B, 23C, and 23D are alternative views of the mounting clamp in accordance with the present disclosure.
Figure 23D:
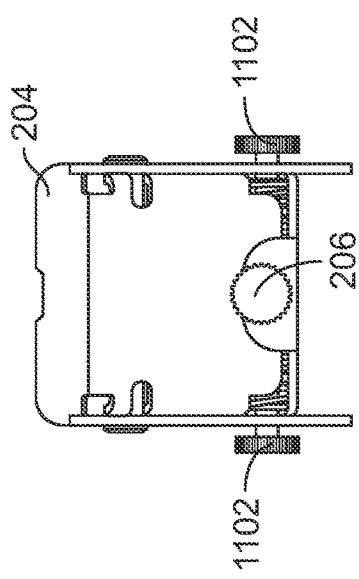
Figure 23A:
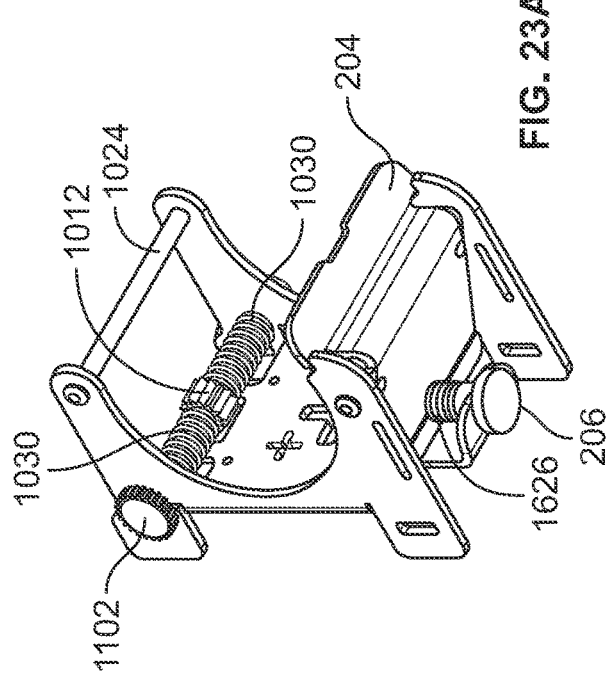
Figure 23C:
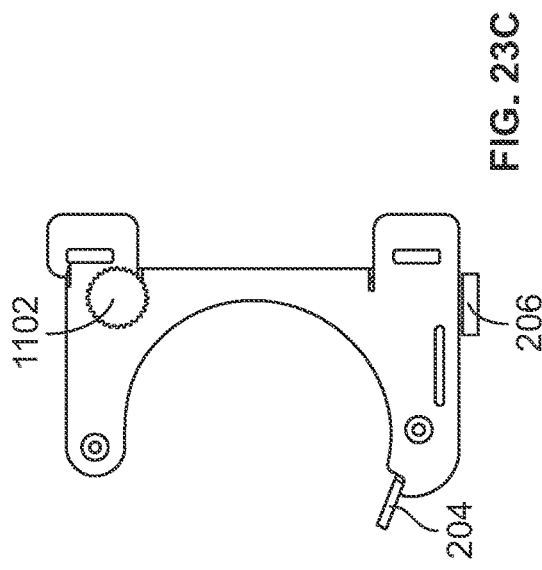

As shown in FIGS. 6 and 7, the electronic module 606 additionally includes various batteries 630, circuits, and a heat sink 632 (discussed in greater detail in FIGS. 19 and 20). The various circuits included in the electronic module 606 are provided to support the wireless and radiofrequency operations of the solar-powered electronic system 100. The various electronic components of the electronic module 606 are connected to the shaft 514 and move concurrently with the shaft and electronic module 606. The various electronic components of the electronic module 606 can be adapted for quickly replacing with updated technology.

Figure 8:
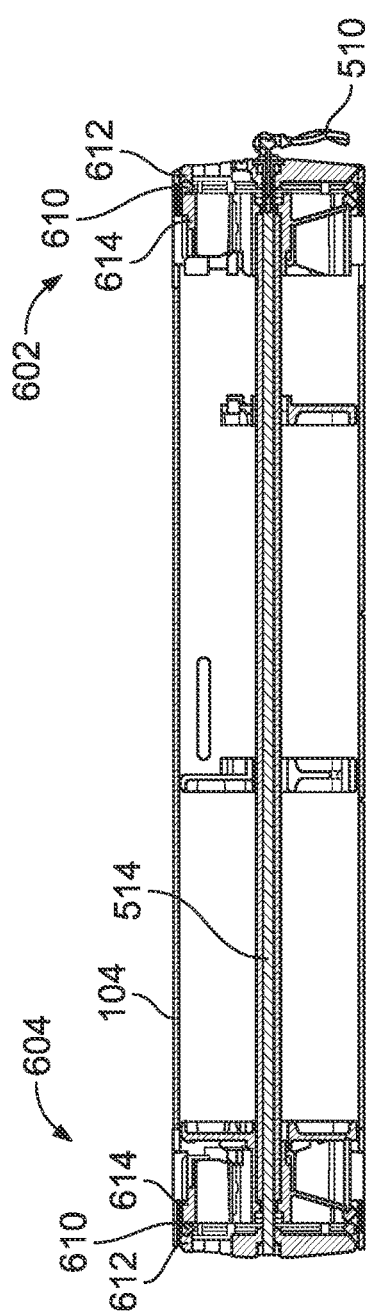
FIG. 8 is a cross-sectional view of the enclosed wireless router of FIGS. 1 and 2 including a quick-release waterproof seal.
Figure 9:
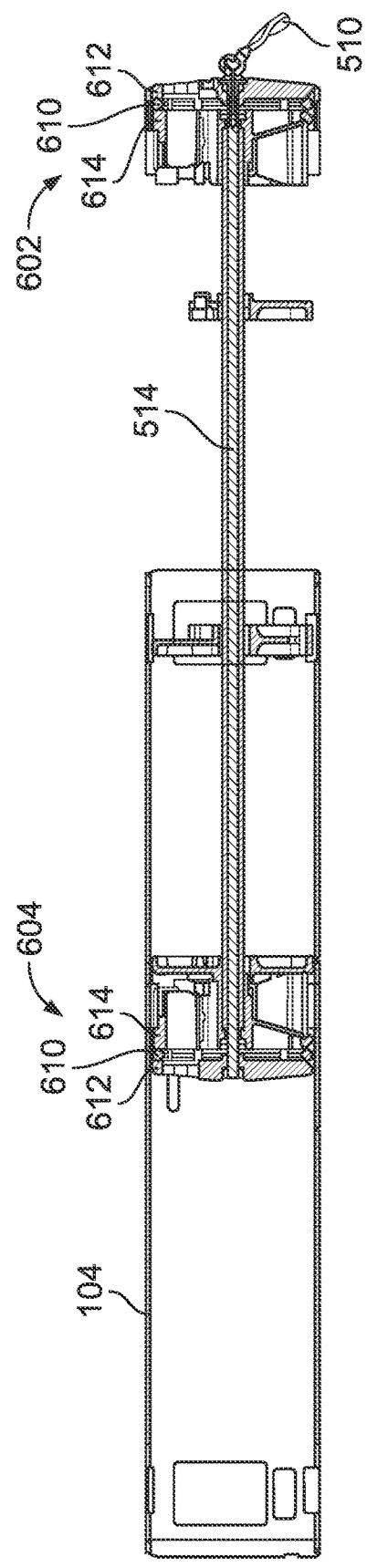
FIG. 9 is a cross section view of the enclosed wireless router of FIGS. 1 and 2 including quick-release waterproof seal in a partially opened configuration.

FIGS. 8 and 9 are a cross-sectional view of the enclosed wireless router 500 including a quick-release waterproof seal. A cam-actuated seal allows for immediate, one-handed, opening and closing of the device for modification or repair, while maintaining a waterproof tube. The waterproof tube in some implementations can conform to IP68 requirements.

Antennas are affixed to the same internal mount as the electronics and batteries. This entire mount is slid in and out of place. When the internal capsule is fully slid into place, an orientation key on either end locks into the correct orientation. This lines the internal antennas up with cutouts in the aluminum, which have polycarbonate "windows" keeping them waterproof while radio frequency (RF) transparent.

In some examples, the tube 104 includes a first key 403 and a second key 404. The first key 403 is configured to correspond with the first cap 502. As a result, the first key 403 causes the electronic module 606 to be aligned with the windows 410 (shown in FIG. 4). Additionally, the tube 104 can include a second key 405 configured to correspond with the second cap 504. Additionally, in some examples, both the first key 403 and the second key 404 are configured to align both the first cap 502 and the second cap 504 simultaneously. As a result, electronics (e.g., antennas) disposed on the first cap 502 and the second cap 504 can be automatically aligned with windows 410 and 412 automatically.

Figure 10:
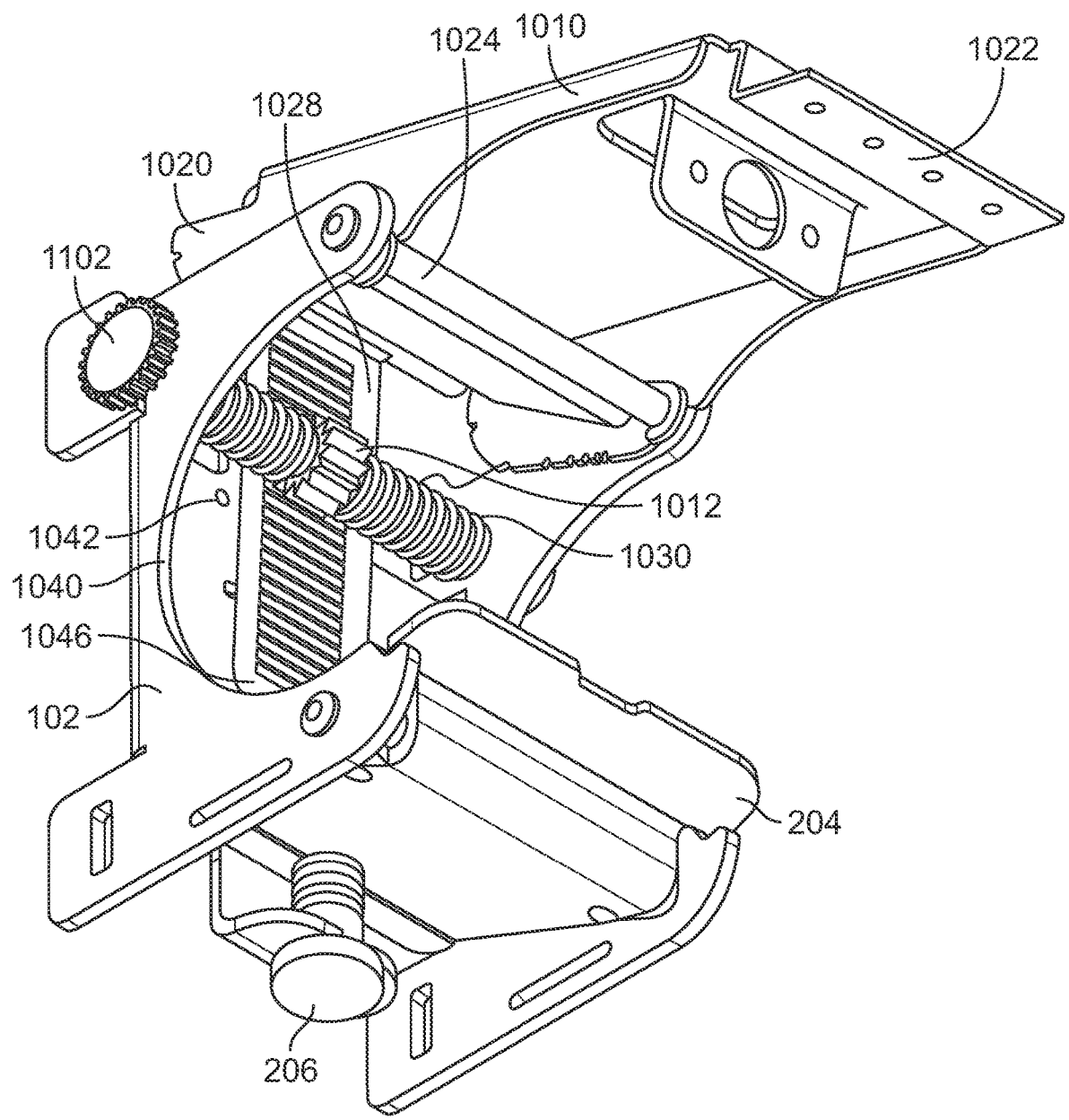
FIG. 10 is a perspective view of the mount of FIG. 1 in accordance with the present disclosure.

FIG. 10 is a perspective view of the mount 102 of FIG. 1 in accordance with the present disclosure. The mount 102 includes a mounting panel 1010, a gear 1012, and a gear shaft 1014.

As shown in FIG. 10, the mounting panel 1010 includes a proximal end 1020, adjacent the mount 102 and a distal end 1022 opposite the proximal end 1020. The mounting panel 1010 is secured to the solar panel 106 via fasteners such as screws or bolts on both the proximal end 1020 and the distal end 1022. The mounting panel is rotationally coupled, relative the mount 102, to an axle 1024. The axle 1024 is positioned such that the mounting panel 1010 is gravity biased to rotate. As shown in FIG. 10, the distal end 1022 of the mounting panel 1010 is gravity biased to rotate downward, towards the mount 102. Additionally, the mounting panel 1010 is configured to couple with a solar panel, which is also biased to rotate with the mounting panel 101. The mounting panel 1010 provides a flexible solution capable of tolerating higher wind speeds than rigidly mounted solar panels. Additionally, the edge 1040 of the mount 102 may include a flexible polymer cover. The flexible polymer cover can bend under pressure to help secure the tube 104 in the mount, inhibiting the tube 104 from vibrating under constantly changing wind forces.

The mounting panel 1010 also includes a tensioned variable ribbon 1028 configured to adjust the angular position of the mounting panel. As shown, the tensioned variable ribbon 1028 is mechanically coupled to the proximal end 1020 of the mounting panel 1010. As a result, the tensioned variable ribbon 1028 counteracts the gravity biased rotation of the mounting panel 1010.

The mount 102 further includes the gear 1012 adapted to adjust the tensioned variable ribbon 1028 and configured to translate between a first position, a second position, and a third position. The gear 1012 is centrally disposed on the mount in the first position, as shown in FIG. 10. The second position and the third position are disposed on either side of the first position. As shown in FIG. 10, the tensioned variable ribbon 1028 includes a plurality of apertures configured to receive the teeth of the gear 1012. Additionally, the gear 1012 is mechanically coupled with a gear shaft 1014. Both the gear 1012 and the gear shaft 1014 are configured to translate together from the first position to the second position or the third position. Additionally, rotating the gear shaft 1014 cause the gear 1012 to rotate. Rotation of the gear 1012 causes the tensioned variable ribbon 1028 to translate vertically. As a result, the mounting plate 1010 pivots about the axle 1024.

The mount 102 additionally includes a spring 1030 adapted to bias the gear 1012 from the second position to the first position or the third position to the first position. As a result, the gear 1012 and the gear shaft 1014 are disposed in the first position as shown in FIG. 10, unless actuated by a user against the force exerted by the spring 1030. In some examples, the mount 102 includes pins 1042 on either side of the variable ribbon 1028 that inhibit the variable ribbon 1028 from pivoting to either side of the mount 102. Additionally, the variable ribbon 1028 may include tabs 1046 (shown in greater detail in FIG. 24B) configured to inhibit the unintentional separation of the variable ribbon 1028 from the mount 102. Specifically, when the gear 1012 is in either the second or third position, the teeth of the gear 1012 will catch on one of the tabs 1046 instead of permitting the variable ribbon from disconnecting from the mount 102.

The gear shaft 1014 includes a hex bushing (not shown) and the mount 102 includes a hex socket configured to receive the hex bushing. When the gear shaft 1014 is disposed in the first position, the hex bushing is disposed in the hex socket. As a result, the gear shaft 1014 is locked and cannot be rotated when in the first position. Accordingly, the tensioned variable ribbon 1028 is also locked and the mounting bracket 1010 is inhibited from pivoting about the axle 1024 when the gear shaft 1014 is disposed in the first position. Other similar locking mechanisms are considered within the scope of this disclosure.

Figure 11:
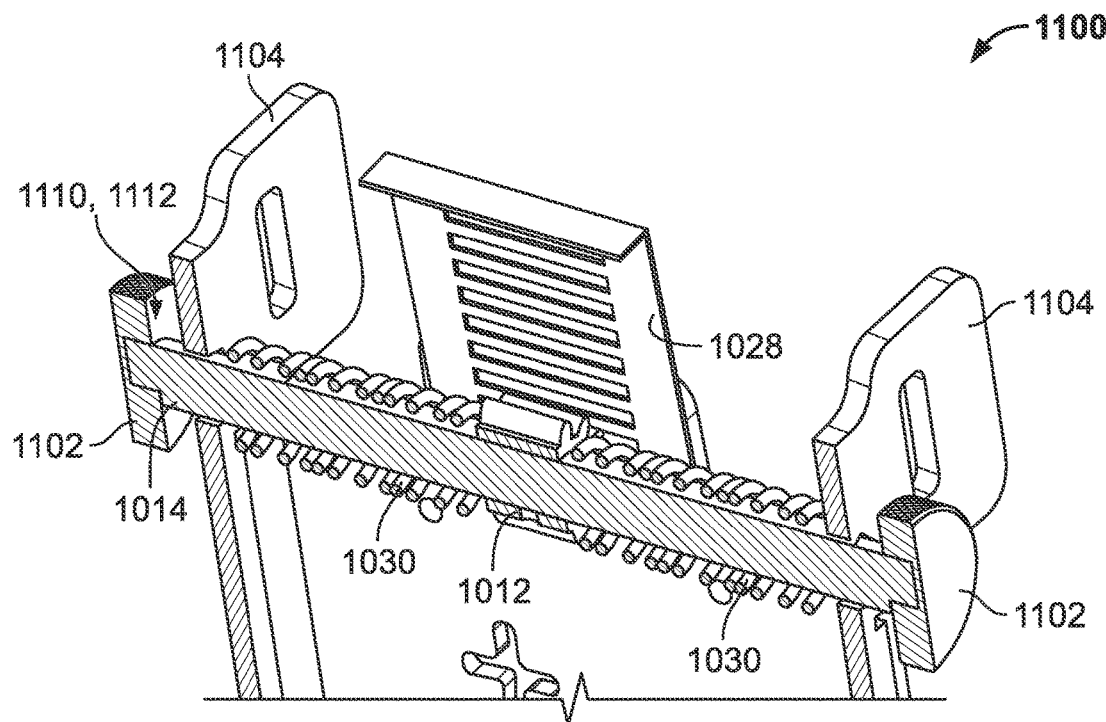
FIG. 11 is a perspective view of a single-hand actuated solar angle set button in a locked configuration accordance with the present disclosure.
Figure 12:
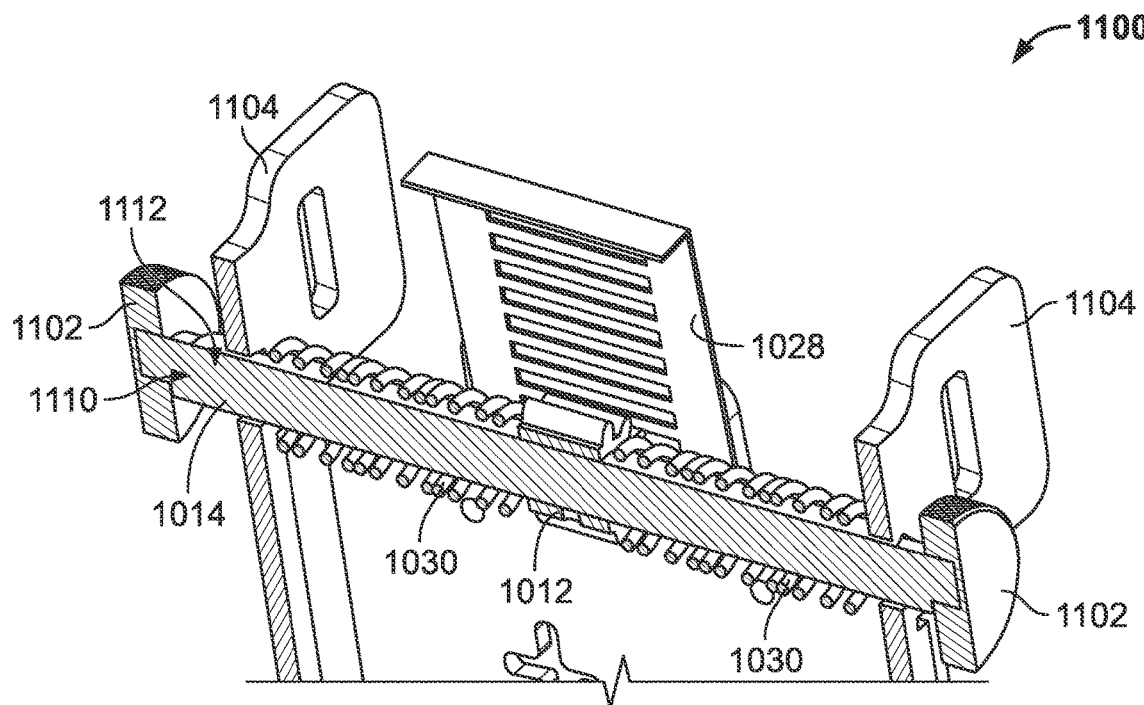
FIG. 12 is a perspective view of the single-hand actuated solar angle set button in an unlocked configuration in accordance with the present disclosure.

FIGS. 11 and 12 are a perspective view of a single-hand actuated solar angle set system 1100 in a first and second position in accordance with the present disclosure. As illustrated, the mount 102 and various other elements are shown as partially cut away. As shown in FIG. 11, the gear 1012 and the gear shaft 1014 are disposed in a first, locked position. In contrast, FIG. 12 shows the gear 1012 and the gear shaft 1014 disposed in a second, unlocked position in which the gear can be rotated and actuate the tensioned variable ribbon 1028.

As shown, the gear shaft 1014 includes a button 1102 on either end of the gear shaft 1014 and a gear 1012 disposed centrally on the gear shaft 1014. The gear shaft 1014 also passes through panels 1104 of the hub 102. The gear shaft 1014 includes a hex bushing 1110 corresponding to a hex socket 1112 disposed in the panels 1104 of the hub 102. As a result, as shown in FIG. 11, the hex bushing 1110 is disposed in the hex socket 1112 and the gear shaft 1014 is inhibited from rotating. In contrast, as shown in FIG. 12, the gear shaft 1014 is pushed or pulled via the button 1102, moving the gear shaft 1014 from the first position to the second position. As a result, the hex bushing 1110 is no longer disposed in the hex socket 1112 and the gear shaft 1014 is free to rotate and actuate the tensioned variable ribbon 1028.

Figure 13:
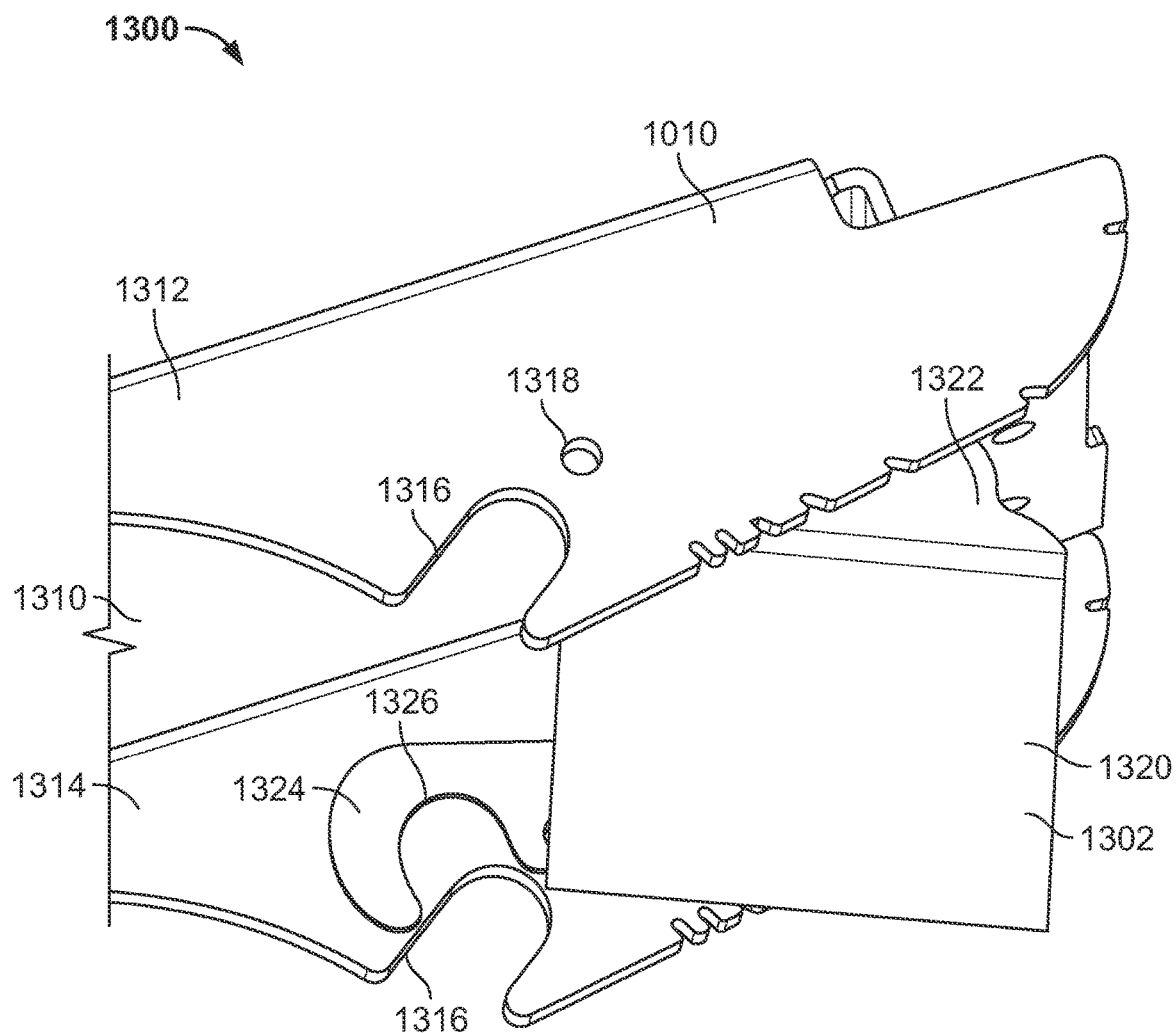
FIGS. 13, 14, and 15 are perspective views of the solar panel quick-lock apparatus in accordance with the present disclosure
Figure 14:
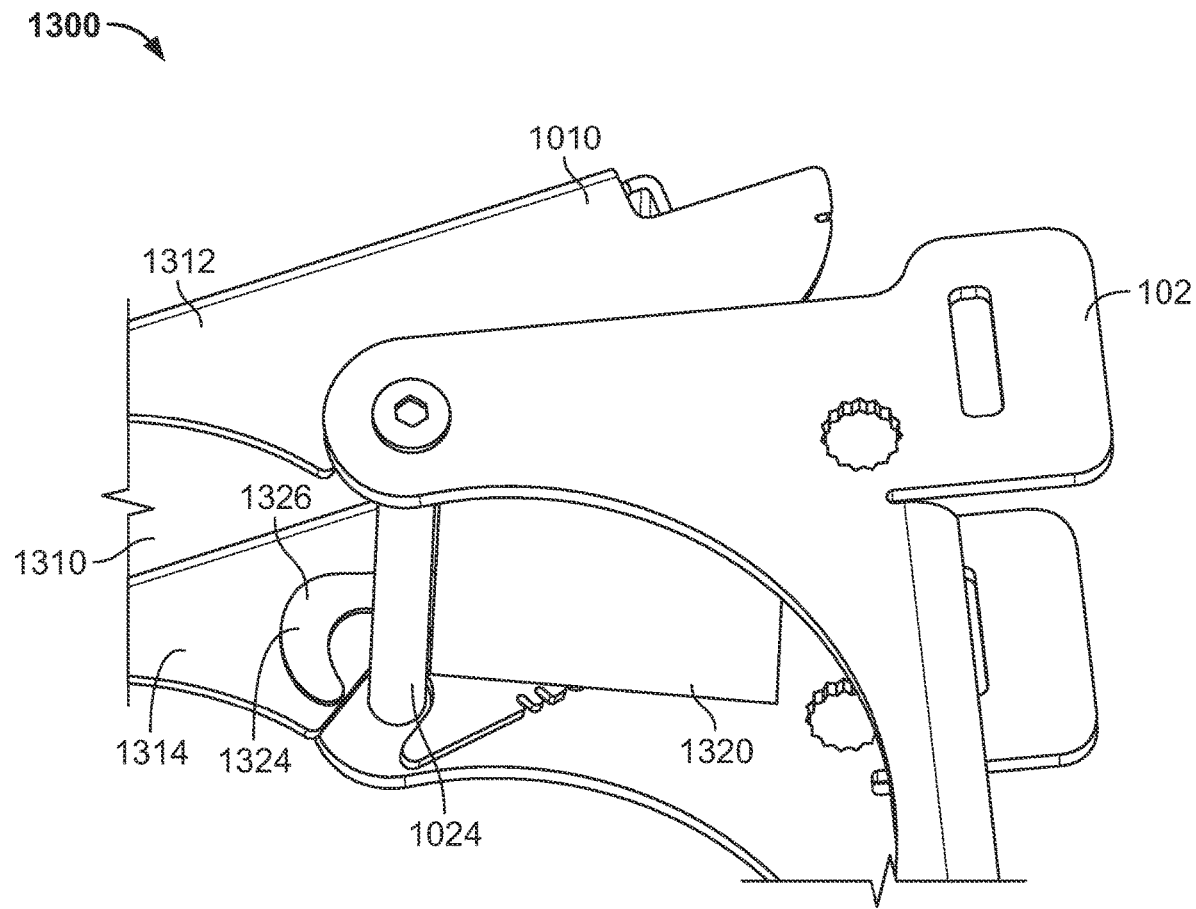
Figure 15:
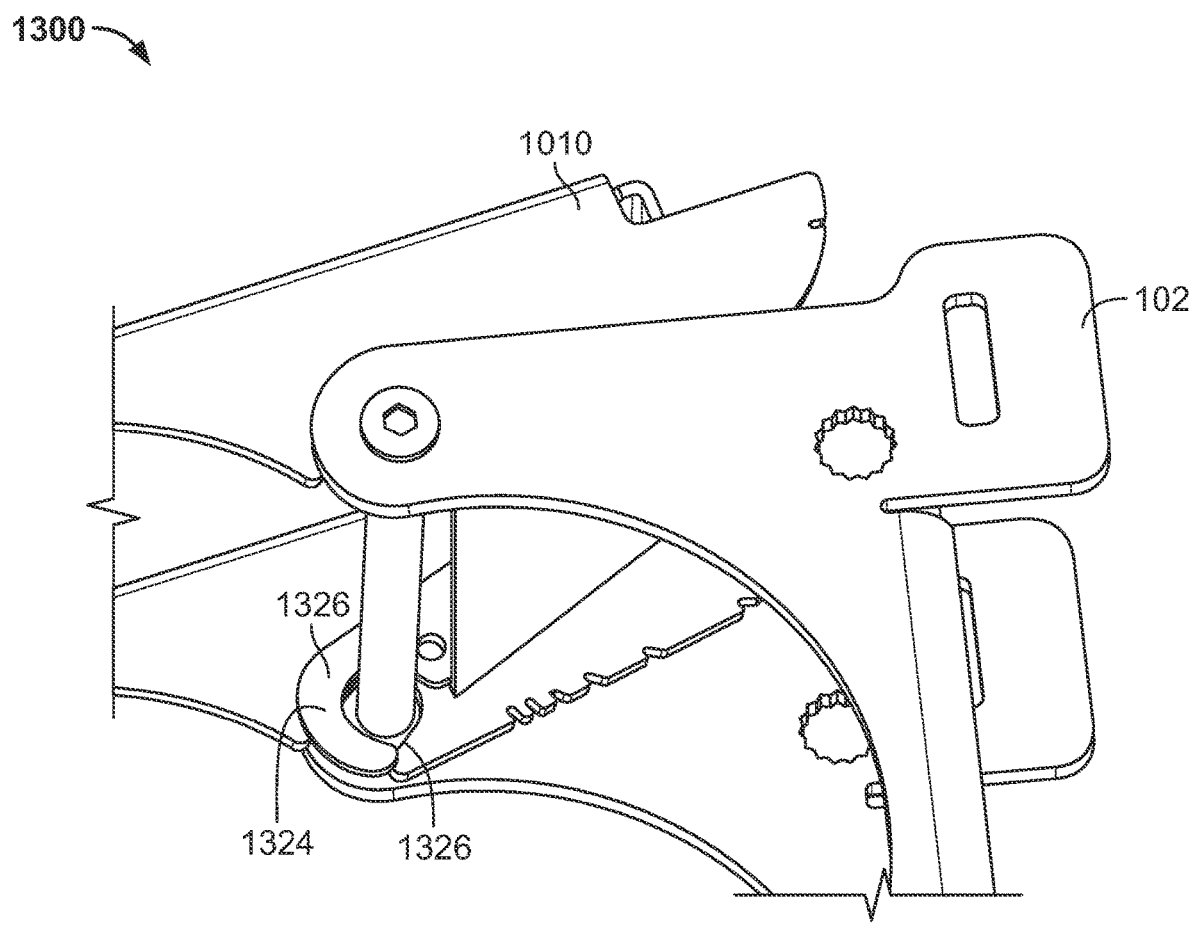

FIGS. 13, 14, and 15 are perspective views of the solar panel quick-lock apparatus 1300 in accordance with the present disclosure. The solar panel quick-lock apparatus 1300 includes the mounting bracket 1010 and a locking paddle 1302. The mounting bracket 1010 includes a top surface 1310, a first panel 1312, and a third panel 1314. The first panel 1312 and the third panel 1314 include a first slot 1316 and an aperture 1318. The slot 1316 is configured to receive an axle.

The locking paddle 1302 includes a push surface 1320, a second panel 1322, and a fourth panel 1324. The locking paddle 1302 also includes a slot 1326 and an aperture (not shown). As shown, the aperture 1318 aligns with the aperture of the locking paddle 1302 such that the mounting bracket 1010 and the locking paddle 1302 are pivotable relative to each other.

In operation, the first panel 1312, including the first slot 1316, is configured to receive the axle 1024 (illustrated in FIGS. 10 and 14) and the first aperture 1318 disposed adjacent the slot. The second panel 1322, pivotable relative to the first panel 1312, includes the second slot 1326 configured to receive the axle 1024 and a second aperture disposed adjacent to the slot. The second panel 1322 is pivotable, relative to the first panel 1312, between a first position (shown in FIGS. 13 and 14) and a second position (shown in FIG. 15). The solar panel quick-lock apparatus 1300 also includes a pivoting axle (not shown) passing through the first aperture 1318 and the second aperture of the second panel 1322.

As shown in FIG. 14, the axle 1024 can be disposed in the first slot 1316 but not disposed in the second slot 1326. But, as shown in FIG. 15, when the locking paddle 1302 is pivoted into the second position, the second slot 1326 receives the axle 1024. The second slot 1326 in the second position is both aligned with the first slot 1316, yet disposed at an angle relative to the first slot 1316, thereby closing the first slot 1316. The axle 1024 disposed in both the first slot 1316 and the second slot 1326 is locked in place. The push surface 1320 is disposed on the underside of the solar panel 106 such that a user can actuate the push surface 1320 while holding the solar panel on the proximal end 107a.

FIGS. 16 and 17 are a side view of the clamping system 1600, in accordance with the present disclosure. The clamping system 1600 includes a static cradle 1602 having a tubular slot 1604, the mounting clamp 204, and an adjustment mechanism 1608. The clamping system 1600 allows a device to be dropped into place and then tightened to the installed mount with a knob and without additional support. Without this, the mounting structure might require multiple people or preassembly.

The clamping system 1600 includes a static cradle 1602 configured to receive the tube 104. After the tube 104 is lowered into the static cradle 1602, the knob on the bottom can be twisted to lift up the far edge of the clamp and lock the enclosure into place. The knob is able to create tension via a sliding T-nut which fits into a slot in the clamp metal, and a compression spring pushing the clamp open. As used in the clamping system 1600, the T-nut does not rotate along with the knob, but rather, as the knob rotates the tension is increased as shown in FIGS. 16 and 17.

The static cradle 1602 defines the tubular slot 1604 having an upper portion 1610 and a lower portion 1612. The mounting clamp 204 includes a pivotable clamp 1606 disposed in the lower portion 1612 of the static cradle 1602 and pivotable about an axle 1616 between a first, open position (shown in FIG. 16) and a second, secured position (shown in FIG. 17). The lower portion 1612 also includes the adjustment mechanism 1608 to pivot the pivotable clamp 1606 from the first position to the second position. The adjustment mechanism 1608 includes a knob 1620, a nut 1622, a shaft 1624, and a spring 1626. Actuating the knob 1620 causes the nut 1622 to move along the shaft 1624 of the actuating mechanism 1608. In one example, rotating the knob 1620 causes the nut 1622 to move against the spring 1626. In such an example, the shaft 1624 includes a screw mechanism to control the position of the nut 1622 as the spring 1626 pushes against the nut 1622. The shaft 1624 may pass through the pivotable clamp 1606 while the nut 1622 is too large to pass through the pivotable clamp 1606. As a result, when the nut 1622 is actuated down towards the actuating mechanism 1620, the nut 1622 contacts the pivotable clamp 1606 and causes the pivotable clamp to pivot about the axle 1616.

As shown in FIG. 16, the pivotable clamp 1606 is pivoted such that the tube 104 can be inserted into the tubular slot 1604. However, when the pivotable clamp 1606 is pivoted into the closed position, the tube 104 is pushed against the upper portion 1610, securing the tube in the tubular slot. In some examples, the pivotable clamp 1606 includes a silicone edge or cover to improve the clamping effect between the pivotable clamp 1606 and the tube 104. Additionally, the pivotable clamp 1606 secures the tube 104 in the static cradle 1602 because the pivotable clamp 1606 in the second position encloses a portion of the tubular slot 1604.

Figure 18:
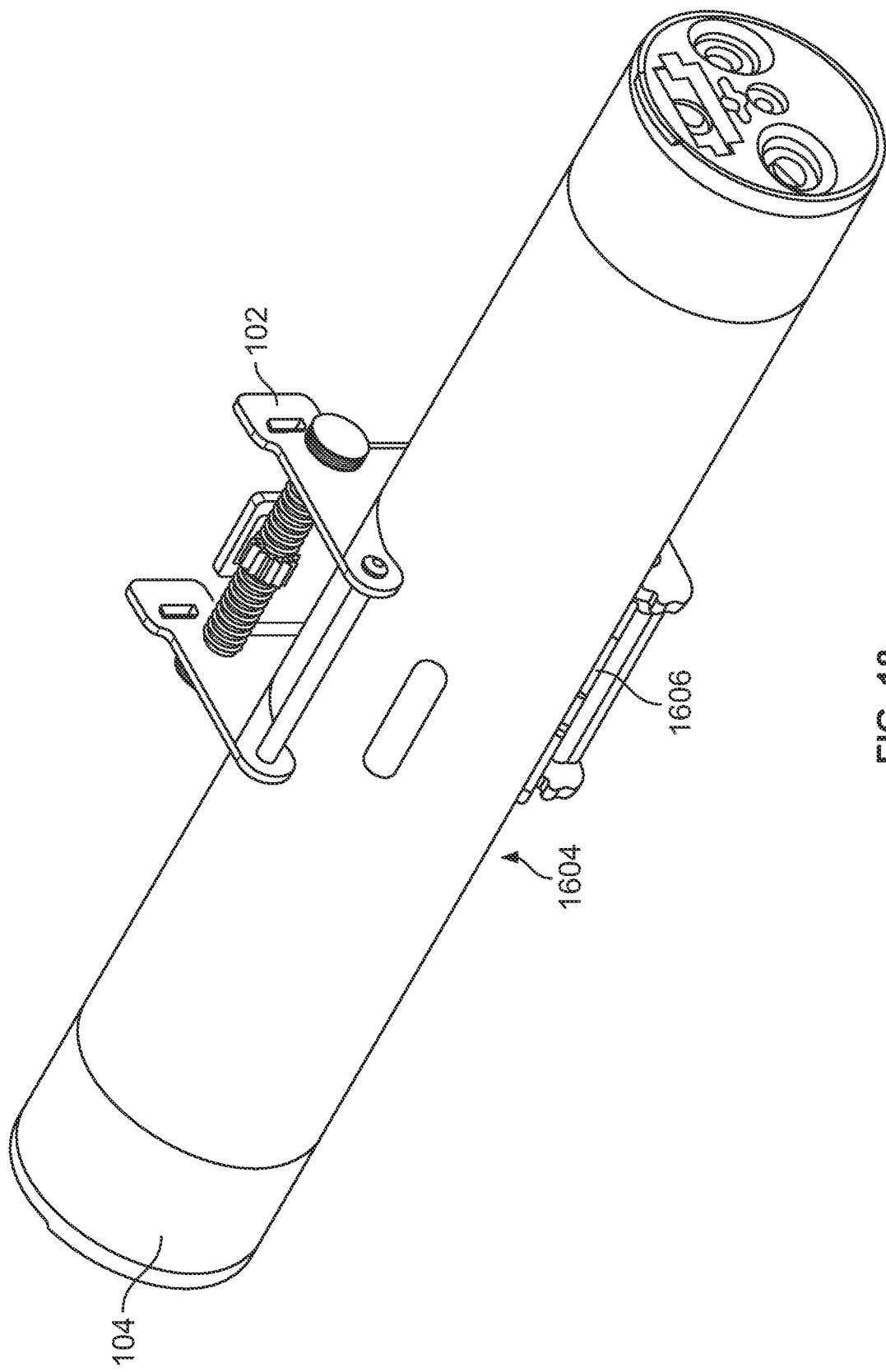
FIG. 18 is a perspective view of the mount and casing in accordance with the present disclosure.

FIG. 18 is a perspective view of the mount 102 and tube 104 in accordance with the present disclosure. As shown, the tube 104 is secured in the mount 102 because the pivotable clamp 1606 is disposed in the second position, securing the tube 104 within the tubular slot 1604.

FIGS. 19 and 20 are perspective views of a sliding heat spreader 2000 in accordance with the present disclosure. Because the tube 104 is designed to be waterproof, the sliding heat spreader 2000 is configured to conduct heat to the outside while not inhibiting movement for assembly and disassembly. Springs continually push the heat spreader against the outer casing for a continuous and dynamic thermal connection. The springs push the heat spreader into the roof of the cylinder with enough force to achieve the necessary thermal conductivity without compromising the ability to shift the electronic module back and forth inside of the tube. As a result, no forced air or liquid cooling is necessary to cool the electronic module. As shown in FIG. 1, the tube 104 is disposed in the shade of the solar panel 106 when the solar panel 106 is oriented toward the sun, and the shade of the solar panel 106 improves the cooling of the tube 104 and the heat spreader 2000.

The heat spreader 2000 includes a heat sink 2002 and a biasing member 2004 (e.g., a spring). The biasing member 2004 is disposed between the heat sink 2002 and the shaft 514. The heat sink 2002 is made of a thermally conductive material, such as a metallic material. Further, the heat sink 2002 matches the curvature of the inner radius of the tube 104. The heat spreader further includes a rim 2006. The rim 2006 facilitates insertion of the heat sink 2002 into the tube 104. To this end, the rim 2006 is configured to be inserted into the tube 104 first. The angle of the rim 2006 causes the heat sink 2002 and the biasing member 2004 to depress when being inserted into the tube 104. In various other examples, the rim 2006 can be rounded.

In various embodiments, the heat spreader 2000 may include a circuit board 2020 and fasteners 2022, 2024. As shown, the circuit board 2020 can be fastened to the biasing member 2004 via the fasteners 2022. As a result, the circuit board 2020 in some implementations is structurally rigid enough to withstand the stresses and forces exerted by the biasing member 2004. Additionally, the circuit board 2020 can be fastened to the heat sink 2002 via fasteners 2024. Alternatively, the circuit board 2020 can be fastened to the heat sink 2002 and/or the biasing member 2004 via a different securing mechanism, such as an adhesive.

As described, the solar-powered electronic system includes electronics and antennas for operation as a wireless router. However, the solar-powered electronic system is not limited to wireless routers. In some examples, the solar-powered electronic system could be used in other industries such as remote weather stations, remote utility computer systems, electrical system infrastructure, etc. Additionally, as shown the solar-powered electronic system can include alternative power source systems such as a wind-powered generator. As a result, the solar-powered electronic system can be used in a variety of outdoor electronic systems to provide an easily mounted, self-powered, and sealed electronic system.

What is claimed:

1. A quick-release tubular seal, comprising:
   a tube including a first end and a second end;
   a first seal assembly configured to selectively seal against the first end of the tube;
   a second seal assembly configured to selectively seal against the second end of the tube;
   a cam disposed on the first seal assembly, the cam being operable between a first position and a second position; and
   a shaft mechanically coupled to the cam, the first seal assembly, and the second seal assembly, the shaft configured to actuate both the first seal assembly to seal against the first end of the tube and actuate the second seal assembly to seal against the second end of the tube when the cam is actuated from the first position to the second position.

2. The quick-release tubular seal of claim 1, wherein the first seal assembly is disposed within a first cap and the second seal assembly is disposed in a second cap.

3. The quick release tubular seal of claim 1, wherein the shaft is disposed along a longitudinal axis of the tube.

4. The quick release tubular seal of claim 3, wherein the shaft is threaded.

5. The quick release tubular seal of claim 1, wherein the first seal assembly and the second seal assembly define radial seals including a sealing ring disposed between and a first beveled plate and a second beveled plate.

6. The quick release tubular seal of claim 5, wherein the first beveled plate is movable relative to the second beveled plate.

7. The quick release tubular seal of claim 6, wherein movement of the second beveled plate towards the first beveled plate displaces the sealing ring radially outward.

8. The quick release tubular seal of claim 5, wherein the sealing ring is a triangular.

\* \* \* \* \*